United States Patent [19]
Garrity et al.

[11] Patent Number: 5,625,361
[45] Date of Patent: Apr. 29, 1997

[54] PROGRAMMABLE CAPACITOR ARRAY AND METHOD OF PROGRAMMING

[75] Inventors: Douglas A. Garrity, Gilbert; Brad D. Gunter, Phoenix; Danny A. Bersch, Gilbert, all of Ariz.

[73] Assignee: Motorola, Inc., Schaumburg, Ill.

[21] Appl. No.: 338,295

[22] Filed: Nov. 14, 1994

[51] Int. Cl.$^6$ ..................................... H03M 1/00
[52] U.S. Cl. ............................................. 341/172
[58] Field of Search ................... 341/172, 155, 341/144, 150

[56] References Cited

U.S. PATENT DOCUMENTS

| | | |
|---|---|---|
| 5,117,206 | 5/1992 | Imamura . |
| 5,229,772 | 7/1993 | Hanlon . |
| 5,235,335 | 8/1993 | Hester et al. . |

OTHER PUBLICATIONS

"Signal Processing", C. Caillon, J.P. Roche, C. Terrier, M. Schmotzer, Elektronik, vol. 35, No. 8, Apr. 1986, Munchen DE, pp. 54–62.

"Programmable Switched–Capacitor Low–Pass Ladder Filters", Howard M. Sandler, Adel S. Sedra, IEEE Journal of Solid–State Circuits, vol. SC–21, No. 6, Dec. 1986, New York, USA, pp. 1109–1119.

*Primary Examiner*—Brian K. Young
*Attorney, Agent, or Firm*—Rennie William Dover

[57] ABSTRACT

A programmable capacitor array (10, 10') and a method for programming the programmable capacitor array (10, 10'). The programmable capacitor array (10, 10') includes an array of capacitors ($C_0$–$C_n$), wherein each capacitor of the array of capacitors ($C_0$–$C_n$) has first and second terminals. The first terminal of each capacitor may be coupled to a first circuit node (11) or to a first reference terminal (13). Likewise, the second terminal of each capacitor may be coupled to a second circuit node (12) or to a second reference terminal (14). One or more capacitors of the array of capacitors ($C_0$–$C_n$) may be selectively coupled across the first (11) and second (12) circuit nodes or coupled across the first (13) and second (14) reference terminals, thereby permitting each capacitor to be electrically isolated from the array of capacitors ($C_0$–$C_n$).

20 Claims, 2 Drawing Sheets

5,625,361

PROGRAMMABLE CAPACITOR ARRAY AND METHOD OF PROGRAMMING

BACKGROUND OF THE INVENTION

The present invention relates, in general, to programmable capacitor arrays and, more particularly, to a programmable capacitor array in which each capacitor of the array can be electrically isolated from other capacitors of the array.

Programmable capacitors are commonly used in such prior art applications as switched-capacitor filters, switched-capacitor gain stages, and switched-capacitor analog-to-digital (A/D) converters. In one type of switched-capacitor application, an operational amplifier is coupled to an active circuit node by means of a capacitor, wherein an output terminal of the operational amplifier is coupled to a first terminal of the capacitor while a second terminal of the capacitor is switched between the active circuit node and a ground potential. In yet another switched-capacitor application, the operational amplifier is coupled to the active circuit node by means of a parallel combination of capacitors. More particularly, the parallel combination of capacitors is coupled such that the first terminals of the capacitors are coupled together and the second terminals of the capacitors are selectively coupled to the active circuit node or to the ground potential. In other words, the capacitance between the output of the operational amplifier and the active circuit node may be selected by coupling the desired second terminals of the capacitors to the active circuit node. A drawback of this type of circuit configuration is that the operational amplifier drives each of the capacitors regardless of whether their second terminals are switched to the active circuit node or to the ground potential. In particular, the speed of the operational amplifier is decreased when a large number of capacitors are coupled to the output node of the operational amplifier. In addition, coupling a large number of capacitors to the output node of the operational amplifier may decrease the stability of the operational amplifier.

Accordingly, it would be advantageous to have a method and a means for decoupling individual capacitors from a parallel combination of capacitors and from the output terminal of an operational amplifier.

DETAILED DESCRIPTION OF THE DRAWINGS

Generally, the present invention provides a switched-capacitor array and a method for programming the switched-capacitor array. More particularly, the switched-capacitor array is a programmable capacitance network that includes an array of capacitors, wherein each capacitor of the array has a set of two terminals that are selectively coupled to corresponding circuit nodes or to corresponding reference terminals. By way of example, each reference terminal is set at a ground potential. Thus, capacitors having both terminals simultaneously coupled to the reference potential are grounded and therefore electrically isolated from the switched-capacitor array. An advantage of being able to electrically isolate capacitors from the array is that, once isolated, they do not degrade the performance of any circuitry coupled to the switched-capacitor array.

Figure 1:
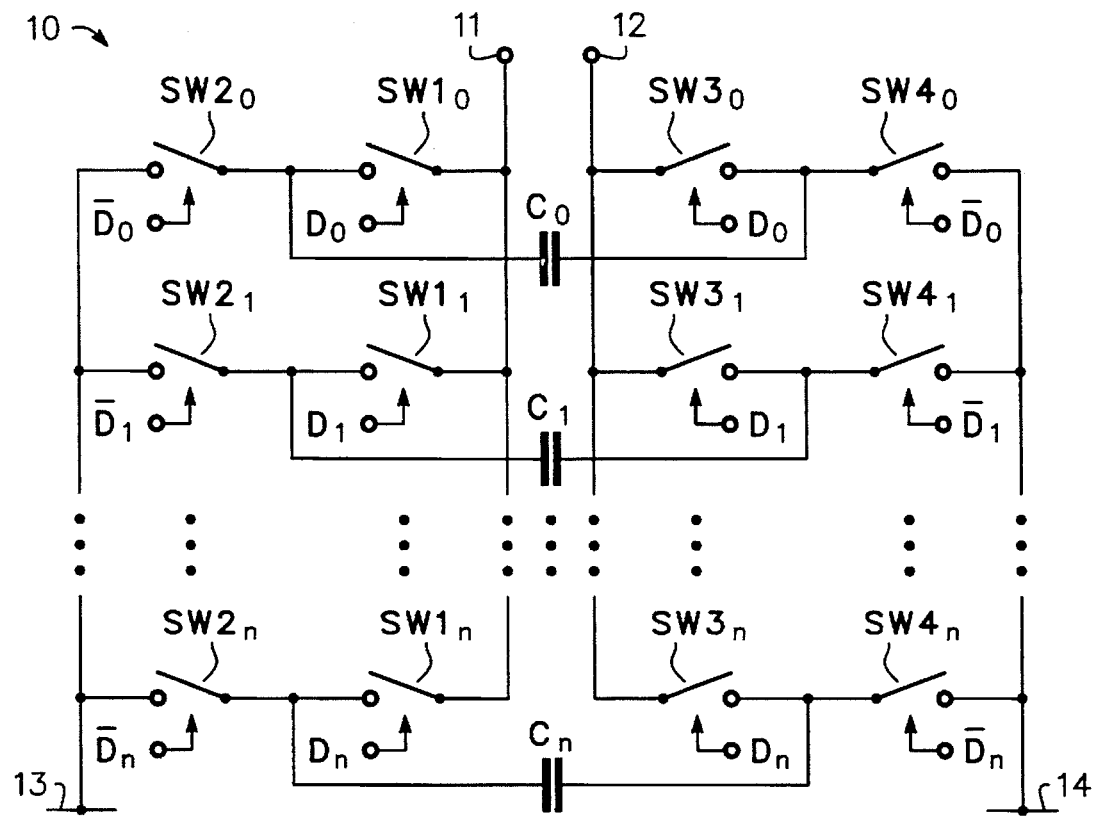
FIG. 1 is a schematic diagram illustrating a switched-capacitor array and switching circuits in accordance with an embodiment of the present invention.

FIG. 1 illustrates a programmable capacitor array 10 having circuit nodes 11 and 12, reference terminals 13 and 14, a plurality of capacitors $C_0$-$C_n$, and a plurality of switching circuits $SW1_0$-$SW1_n$, $SW2_0$-$SW2_n$, $SW3_0$-$SW3_n$, and $SW4_0$-$SW4_n$. Circuit nodes 11 and 12 and reference terminals 13 and 14 serve as network terminals. In one embodiment, reference terminals 13 and 14 are coupled to the same potential, e.g., a ground potential. It should be understood that the size of programmable capacitor array 10, i.e., the number of capacitors in the capacitor array, is not a limitation of the present invention and that the use of the subscripted variable "n" in the reference numerals for the capacitors (C) and switching circuits (SW1, SW2, SW3, and SW4) is intended to illustrate that there may be a plurality or array of capacitors and switching circuits. A first terminal of capacitor $C_0$ is coupled to circuit node 11 via switching circuit $SW1_0$ and to reference terminal 13 via switching circuit $SW2_0$. A second terminal of capacitor $C_0$ is coupled to circuit node 12 via switching circuit $SW3_0$ and to reference terminal 14 via switching circuit $SW4_0$. Switching circuits $SW1_0$ and $SW3_0$ are controlled by a control signal $D_0$, whereas switching circuits $SW2_0$ and $SW4_0$ are controlled by a control signal $\overline{D_0}$. By way of example, control signals $D_0$ and $\overline{D_0}$ are digital signals wherein digital signal $\overline{D_0}$ is a complementary or inverted form of digital signal $D_0$.

Figure 2:
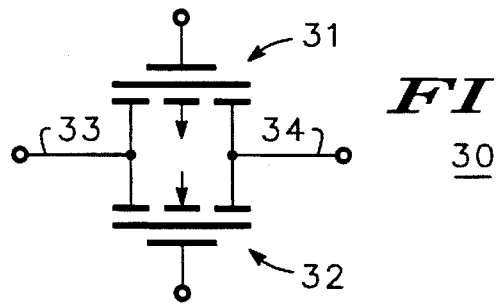
FIG. 2 is a schematic diagram illustrating the switching circuits of FIG. 1.

FIG. 2 illustrates a schematic diagram of a switching circuit 30 suitable for receiving both non-inverted and inverted control signals $D_0$–$D_n$ and $\overline{D_0}$–$\overline{D_n}$, respectively. It should be understood that the same reference numerals are used in the figures to denote the same elements. Switching circuit 30 comprises a P-channel transistor 31 having a control electrode (e.g., a gate electrode) and first and second current conducting electrodes (e.g., source and drain electrodes) and an N-channel transistor 32 having a control electrode (e.g., a gate electrode) and first and second current conducting electrodes (source and drain electrodes). By way of example, transistors 31 and 32 are coupled as a CMOS (complementary metal oxide semiconductor) transmission gate. It should be understood by those skilled in the art that when transistors 31 and 32 are coupled as a transmission gate, a source/drain of P-channel transistor 31 is coupled to a source/drain of N-channel transistor 32 to form a signal terminal 33 of switching circuit 30 wherein the gate electrode serves as a first control terminal of the transmission gate, and a source/drain of P-channel transistor 31 is coupled to a source/drain of N-channel transistor 32 to form a signal terminal 34 of switching circuit 30, wherein the gate electrode serves as a second control terminal of the transmission gate. A gate of P-channel transistor 31 is coupled to receive a control or digital signal such as control signals $\overline{D_0}$–$\overline{D_n}$, whereas a gate of N-channel transistor 32 is coupled to receive a control or digital signal such as control signals $D_0$–$D_n$. Thus, a logic one at the gate terminal of N-channel transistor 32 activates transmission gate 30, thereby completing a conduction path between terminals 33 and 34 and a logic zero at the gate terminal of N-channel transistor 32 or a logic one at the gate terminal of P-channel transistor 31 inactivates transmission gate 30. Although not shown, inverted signals $\overline{D_0}$–$\overline{D_n}$ may be realized by coupling the respective non-inverted control signals $D_0$–$D_n$ to the gate of P-channel transistor 31 via an inverter. It should be understood that each switching circuit $SW1_0$–$SW1_n$, $SW2_0$–$SW2_n$, $SW3_0$–$SW3_n$, and $SW4_0$–$SW4_n$ may be implemented by a switching circuit or transmission gate 30. Thus, switching circuits $SW1_0$–$SW1_n$ form a first plurality of transmission gates or switching elements, switching circuits $SW2_0$–$SW2_n$ form a second plurality of transmission gates or switching elements, switching circuits $SW3_0$–$SW3_n$ form a third plurality of transmission gates or switching elements, and switching circuits $SW4_0$–$SW4_n$ form a fourth plurality of transmission gates or switching elements. It should be noted that switching circuits $SW1_0$–$SW1_n$ serve as a means for selectively coupling the first terminals of respective capacitors $C_0$–$C_n$ to circuit node 11 and switching circuits $SW3_0$–$SW3_n$ serve as a means for selectively coupling the respective second terminal of capacitor $C_0$–$C_n$ to circuit node 12. In other words, a control electrode is coupled to receive the digital signal, $D_o$, the first current conducting electrode of switching circuit $SW1_0$ is coupled to circuit node 11, and the second current conducting electrode of switching circuit $SW1_0$ is coupled to the first terminal of the capacitor $C_o$. In addition, a control electrode of switching circuit $SW2_0$ is coupled for receiving the inverted digital signal $\overline{Do}$, the first current conducting electrode of switching circuit $SW2_0$ is coupled to the first terminal of capacitor $C_o$, and the second current conducting electrode of switching circuit $SW2_0$ is coupled to reference terminal 13; a control electrode of switching circuit $SW3_0$ is coupled for receiving the digital signal Do, the first current conducting electrode of switching circuit $SW3_0$ is coupled to circuit node 12, and the second current conducting electrode of switching circuit $SW3_0$ is coupled to the second terminal of capacitor $C_o$; a control electrode of switching circuit $SW4_0$ is coupled for receiving the inverted digital signal $\overline{Do}$, the first current conducting electrode of switching circuit $SW4_0$ is coupled to the second terminal of capacitor $C_o$, and the second current conducting electrode of switching circuit $SW4_0$ is coupled to reference terminal 14. It should be further understood that the type of circuit for switching circuits $SW1_0$–$SW1_n$, $SW2_0$–$SW2_n$, $SW3_0$–$SW3_n$, and $SW4_0$–$SW4_n$ is not limited to a CMOS transmission gate but may include single n-channel or p-channel MOSFET transistors, other FET (field effect transistors) transistors such as, for example, MESFETs (metal-semiconductor field effect transistors), JFETs (junction field effect transistors), HFETs (heterojunction field effect transistors), bipolar transistor switching circuits, and the like.

Referring again to FIG. 1 and in accordance with one embodiment of the present invention, programmable capacitor array 10 comprises an array of "n+1" capacitors, i.e., one or more capacitors. The number of capacitors set by the value of the variable "n", is a design choice selected for the particular application. Preferably, the capacitance values of the capacitors are selected such that capacitor $C_0$ has the largest capacitance value, denoted by the variable "C". Capacitor $C_1$ has a value of C/2, capacitor $C_2$ has a value of C/4, capacitor $C_3$ has a value of C/8, and capacitor $C_n$ has a value of $C/2^n$. In other words, capacitor $C_1$ has a capacitance value of half the capacitance value of capacitor $C_0$, capacitor $C_2$ has a capacitance value of half of the capacitance value $C_1$, i.e., capacitor $C_n$ has a capacitance value of half of capacitor $C_{(n-1)}$.

In addition, programmable capacitor array 10 is manufactured to optimize design parameters such as RC (resistor-capacitor) time constants, sizes of switching circuits, capacitance values, etc. In a first example, programmable capacitor array 10 is optimized to achieve a specified RC time constant. For capacitor $C_0$ sized to have the largest capacitance value, switching circuits $SW1_0$, $SW2_0$, $SW3_0$, and $SW4_0$ are sized such that their on-resistance, in conjunction with the capacitance of capacitor $C_0$, meets the desired RC time constant. As those skilled in the art are aware, switching circuits comprising transistors (e.g., transistors 31 and 32 of FIG. 2) each have on-resistances that are set by their width-to-length ratio, i.e., their W/L ratio. It should be noted that the on-resistances of the transistors are decreased by increasing their W/L ratio. In other words, the on-resistances of the transistors are decreased by making the transistors larger, i.e., increasing the area of the semiconductor substrate in which the switching circuits are manufactured. In accordance with the first example, the W/L ratios of all the switching circuits are designed to be equal to those of switching circuits $SW1_0$, $SW2_0$, $SW3_0$, and $SW4_0$; thereby ensuring that the specified RC time constant is met. By way of example, the switching circuits $SW1_0$–$SW1_n$, $SW2_0$–$SW2_n$, $SW3_0$–$SW3_n$, and $SW4_0$–$SW4_n$ have a W/L ratio of 100/4 for capacitor $C_0$ having a capacitance value of 15 picofarads (pF).

It should be understood that setting all the switching circuit W/L ratios equal to those of switching circuits $SW1_0$, $SW2_0$, $SW3_0$, and $SW4_0$ consumes a large amount of the semiconductor substrate because the sizes of switching circuits $SW1_1$–$SW1_n$, $SW2_1$–$SW2_n$, $SW3_1$–$SW3_n$, and $SW4_1$–$SW4_n$ are larger than necessary to achieve the desired RC time constant. Accordingly, in a second example each capacitor-switching circuit combination is sized to have the desired RC time constant. Thus, switching circuits $SW1_1$, $SW2_1$, $SW3_1$, and $SW4_1$ are sized so that each of their on-resistances in combination with the capacitance value of capacitor $C_1$ achieves the RC time constant. It should be noted that since capacitor $C_1$ has a smaller capacitance value than capacitor $C_0$ switching circuits $SW1_1$, $SW2_1$, $SW3_1$, and $SW4_1$ will have a larger on-resistance than switching circuits $SW1_0$, $SW2_0$, $SW3_0$, and $SW4_0$ to achieve the desired RC time constant. In other words, switching circuits $SW1_1$, $SW2_1$, $SW3_1$, and $SW4_1$ will have a smaller W/L ratio than capacitors $SW1_0$, $SW2_0$, $SW3_0$, and $SW4_0$. Likewise, switching circuits $SW1_n$, $SW2_n$, $SW3_n$, and $SW4_n$ are sized so that each of their onresistances in combination with the capacitance value of capacitor $c_n$ achieves the desired RC time constant. Since capacitor $c_n$ has a smaller capacitance value than capacitors $C_0$ and $C_1$, switching circuits $SW1_n$, $SW2_n$, $SW3_n$, and $SW4_n$ will have larger on-resistances than switching circuits $SW1_0$, $SW2_0$, $SW3_0$, $SW4_0$, $SW1_1$, $SW2_1$, $SW3_1$, and $SW4_1$ to achieve the desired RC time constant. Thus, switching circuits $SW1_n$, $SW2_n$, $SW3_n$, and $SW4_n$ will have smaller W/L ratios than switching circuits $SW1_0$, $SW2_0$, $SW3_0$, $SW4_0$, $SW1_1$, $SW2_1$, $SW3_1$, and $SW4_1$. By way of example, switching circuits $SW1_0$, $SW2_0$, $SW3_0$, and $SW4_0$ have a W/L ratio of 100/4 for capacitor $C_0$ having a capacitance value of 15 pF; switching circuits $SW1_1$, $SW2_1$, $SW3_1$, and $SW4_1$ have a W/L ratio of 50/4 for capacitor $C_1$ having a capacitance value of 7.5 pF; and switching circuits $SW1_n$, $SW2_n$, $SW3_n$, and $SW4_n$ have a ratio of $(100/2^n)/4$ for capacitor $c_n$ having a capacitance value of $C/2^n$, wherein the variable "n" denotes the sequential number of the capacitor in the programmable capacitor array. In other words, "n" equals 0 for capacitor $C_0$ because it is the first capacitor in the capacitor array, "n" equals 1 for capacitor $C_1$ because it is the second capacitor in the capacitor array, etc.

In yet a third example, the sizes (i.e., the W/L ratios) of switching circuits $SW1_0$–$SW1_n$ and $SW3_0$–$SW3_n$ are selected so that the combination of capacitors $C_0$–$C_n$ and each respective switching circuit $SW1_0$–$SW1_n$ and $SW3_0$–$SW3_n$ has at most the desired RC time constant. More particularly, the on-resistances of switching circuits $SW1_0$–$SW1_n$ and $SW3_0$–$SW3_n$ are selected such that the sums of the on-resistances of switches $SW1_0$–$SW1_n$ and the respective switches $SW3_0$–$SW3_n$ are less than a predetermined value. The sizes of the switching circuits $SW2_0$–$SW2_n$ and $SW4_0$–$SW4_n$, on the other hand, are selected to minimize the amount of semiconductor substrate area occupied by the switching circuits. By way of example, switching circuits $SW1_0$–$SW1_n$ and $SW3_0$–$SW3_n$ have a W/L ratio of 100/4 for capacitor $C_0$ having a capacitance value of 15 pF and switching circuits $SW2_0$–$SW2_n$ and $SW4_0$–$SW4_n$ have a W/L ratio of 4/4.

In yet a fourth example, the sizes of switching circuits $SW1_0$–$SW1_n$ and $SW3_0$–$SW3_n$ are selected so that in combination with the respective capacitors $C_0$–$C_n$, the desired RC time constant is achieved. The sizes of the switching circuits $SW2_0$–$SW2_n$ and $SW4_0$–$SW4_n$, on the other hand, are selected to minimize the amount of semiconductor substrate area these switching circuits occupy. By way of example, switching circuits $SW1_0$ and $SW3_0$ have a W/L ratio of 100/4 for capacitor $C_0$ having a capacitance value of 15 pF; switching circuits $SW1_1$ and $SW3_1$ have a W/L ratio of 50/4 for capacitor $C_1$ having a capacitance value of 7.5 pF; and switching circuits $SW1_n$ and $SW3_n$ have a ratio of $(100/2^n)/4$ for capacitor $c_n$ having a capacitance value of $C/2^n$, wherein the variable "n" denotes the sequential number of the capacitor in the programmable capacitor array. In other words, "n" equals 0 for capacitor $C_0$ because it is the first capacitor in the capacitor array, "n" equals 1 for capacitor $C_1$ because it is the second capacitor in the capacitor array, etc.

Figure 3:
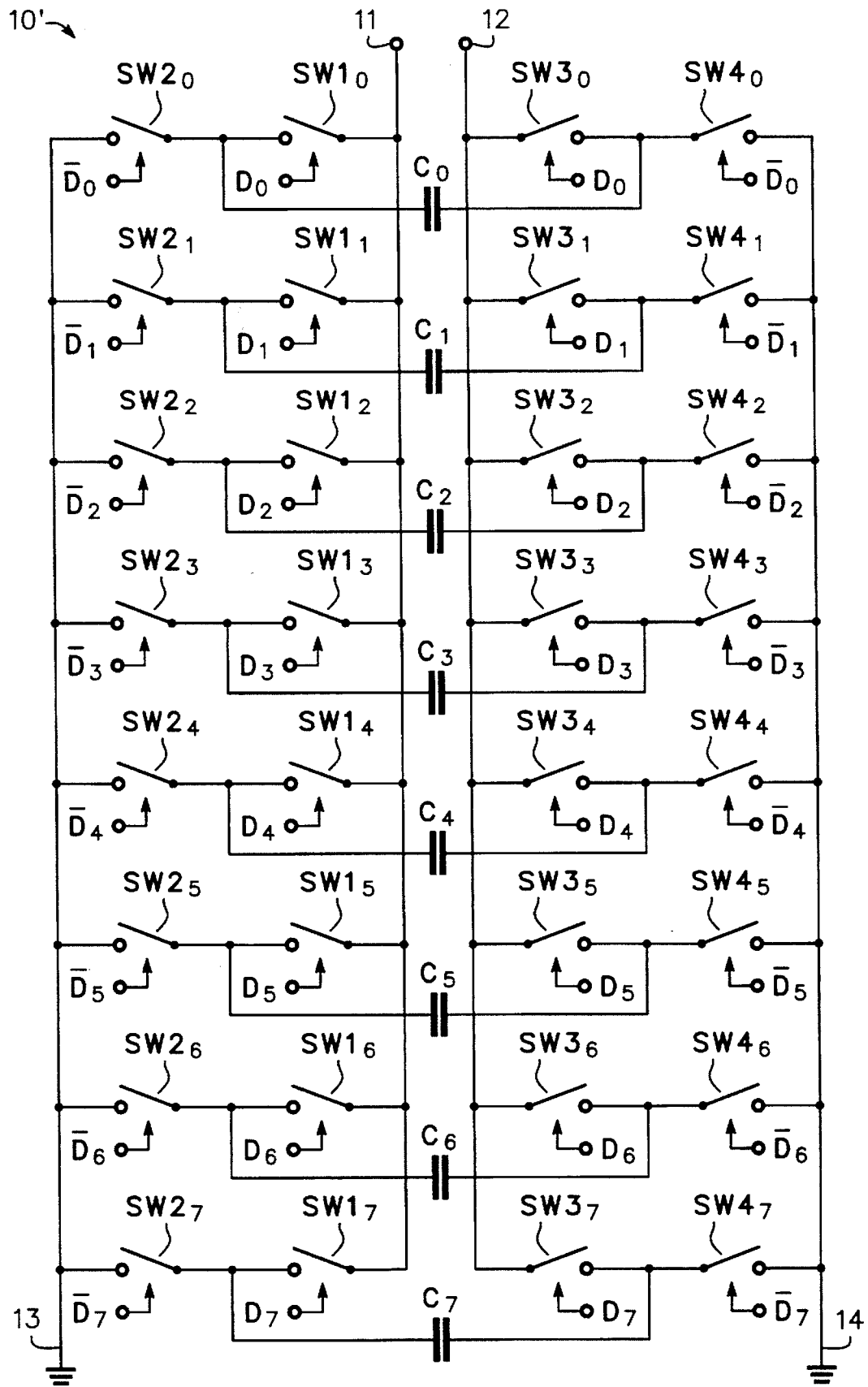
FIG. 3 is a schematic diagram illustrating an eight bit switched-capacitor array in accordance with another embodiment of the present invention.

FIG. 3 illustrates an embodiment of programmable capacitor array 10' in accordance with the present invention, wherein programmable capacitor array 10' comprises eight capacitors $C_0$, $C_1$, $C_2$, $C_3$, $C_4$, $C_5$, $C_6$, and $C_7$ and switching circuits $SW1_0$–$SW1_7$, $SW2_0$–$SW2_7$, $SW3_0$–$SW3_7$, and $SW4_0$–$SW4_7$, i.e., capacitor array 10' is an eight bit capacitor array. By way of example, capacitors $C_0$, $C_1$, $C_2$, $C_3$, $C_4$, $C_5$, $C_6$, and $C_7$ have capacitance values of approximately 15 pF, 7.5 pF, 3.75 pF, 1.875 pF, 0.938 pF, 0.469 pF, 0.234 pF, and 0.117 pF, respectively, and terminals 13 and 14 are coupled to a ground potential. In other words, capacitor $C_1$ has a capacitance value of approximately half the capacitance value of capacitor $C_0$, capacitor $C_2$ has a capacitance value of approximately half of the capacitance value $C_1$, capacitor $C_3$ has a capacitance value of approximately half of the capacitance value $C_2$, capacitor $C_4$ has a capacitance value of approximately half of the capacitance value $C_3$, capacitor $C_5$ has a capacitance value of approximately half of the capacitance value $C_4$, capacitor $C_6$ has a capacitance value of approximately half of the capacitance value $C_5$, capacitor $C_7$ has a capacitance value of approximately half of the capacitance value $C_6$. To couple a capacitance value of 15 pF across circuit nodes 11 and 12, a control signal $D_0$ is supplied to switching circuits $SW1_0$, $SW2_0$, $SW3_0$, and $SW4_0$, thereby electrically connecting the first and second terminals of capacitor $C_0$ to circuit nodes 11 and 12, respectively. In addition, the first and second terminals of capacitor $C_0$ are electrically isolated from terminals 13 and 14, i.e., isolated from ground. Furthermore, control signals $\overline{D_1}$–$\overline{D_7}$ are supplied to switches $SW1_1$–$SW1_7$, $SW2_1$–$SW2_7$, $SW3_1$–$SW3_7$, and $SW4_1$–$SW4_7$, thereby electrically connecting the first and second terminals of capacitors $C_1$–$C_7$ to terminals 13 and 14, i.e., grounding the first and second terminals of capacitors $C_1$–$C_7$.

Still referring to FIG. 3, a capacitance value of approximately 16.875 pF is coupled across circuit nodes 11 and 12 by supplying a control signal $D_0$ to switching circuits $SW1_0$, $SW2_0$, $SW3_0$, and $SW4_0$ and supplying a control signal $D_3$ to switching circuits $SW1_3$, $SW2_3$, $SW3_3$, and $SW4_3$, thereby electrically connecting the first and second terminals of capacitors $C_0$ and $C_3$ to circuit nodes 11 and 12, respectively. In addition, the first and second terminals of capacitors $C_0$ and $C_3$ are electrically isolated from terminals 13 and 14, i.e., isolated from ground. Furthermore, control signal $\overline{D_1}$ is supplied to switching circuits $SW1_1$, $SW2_1$, $SW3_1$, and $SW4_1$; control signal $\overline{D_2}$ is supplied to switching circuits $SW1_2$, $SW2_2$, $SW3_2$, and $SW4_2$; control signal $\overline{D_4}$ is supplied to switching circuits $SW1_4$, $SW2_4$, $SW3_4$, and $SW4_4$; control signal $\overline{D_5}$ is supplied to switching circuits $SW1_5$, $SW2_5$, $SW3_5$, and $SW4_5$; control signal $\overline{D_6}$ is supplied to switching circuits $SW1_6$, $SW2_6$, $SW3_6$, and $SW4_6$; and control signal $\overline{D_7}$ is supplied to switching circuits $SW1_7$, $SW2_7$, $SW3_7$, and $SW4_7$; thereby electrically connecting the first and second terminals of the respective capacitors $C_1$, $C_2$, $C_4$, $C_5$, $C_6$, and $C_7$ to terminals 13 and 14, i.e., grounding the first and second terminals of capacitors $C_1$, $C_2$, $C_4$, $C_5$, $C_6$, and $C_7$. It should be understood by those skilled in the art that individual or selected combinations of capacitors $C_1$–$C_7$ may be coupled to circuit nodes 11 and 12 or coupled to terminals 13 and 14, i.e., grounding capacitors $C_1$, $C_2$, $C_4$, $C_5$, $C_6$, and $C_7$, by applying appropriate control signals $D_0$–$D_7$ and $\overline{D_0}$–$\overline{D_7}$ to switching circuits $SW1_0$–$SW1_7$, $SW2_0$–$SW2_7$, $SW3_0$–$SW3_7$, and $SW4_0$–$SW4_7$.

Figure 4:
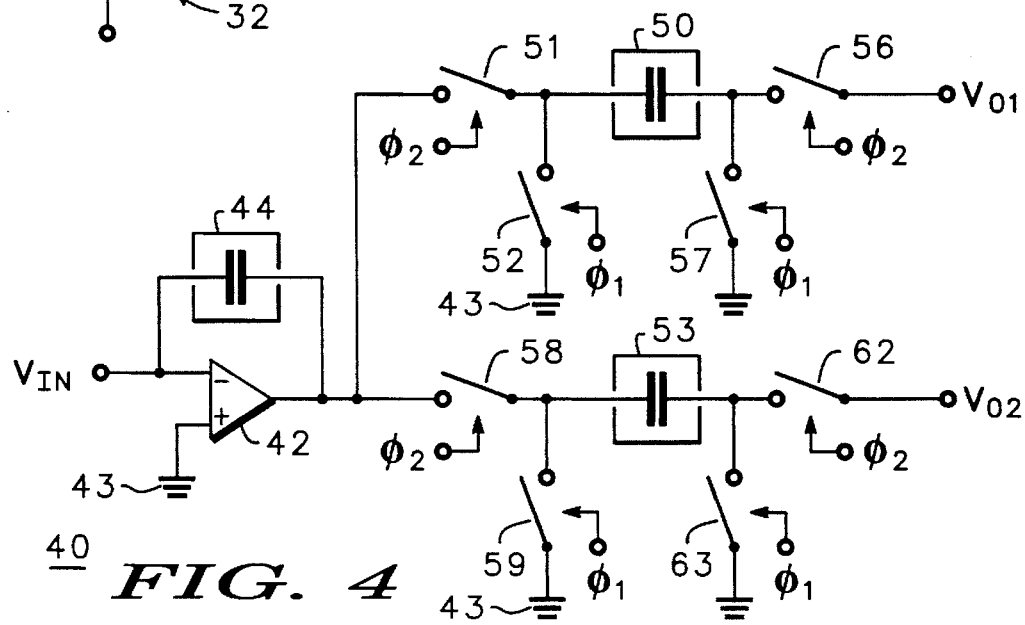
FIG. 4 is a schematic diagram illustrating an amplifier arrangement having switched-capacitor arrays in accordance with the embodiment of FIG. 1.

FIG. 4 illustrates a switched-capacitor circuit 40 suitable for manufacturing as an integrated circuit using conventional integrated circuit processing techniques. Amplifier circuit 40 includes operational amplifier (OPAMP) 42 having an inverting input terminal coupled for receiving an input signal $V_{IN}$. A non-inverting input terminal of OPAMP 42 is coupled to an analog ground potential 43. A programmable capacitor array 44 is coupled between the output terminal of OPAMP 42 and its inverting input terminal to provide a selectable feedback impedance for switched-capacitor circuit 40.

In addition, the output terminal of OPAMP 42 is coupled through a switching circuit 51, a programmable capacitor array 50, and a switching circuit 56 to an output node $V_{o1}$. The input terminal of programmable capacitor array 50 is coupled to a reference potential such as an analog ground potential 43 by a switching circuit 52 and the output terminal of programmable capacitor array 50 is coupled to analog ground potential 43 by a switching circuit 57. An output signal appearing at output node $V_{o1}$ is applied to other functional circuitry (not shown). Switching circuits 52 and 57 operate in response to a first phase ($100_1$) of a system clock, whereas switching circuits 51 and 56 operate in response to a second phase ($100_2$) of the system clock.

Further, the output terminal of OPAMP 42 is coupled through a switching circuit 58, a programmable capacitor array 53, and a switching circuit 62 to an output node $V_{o2}$. The input terminal of programmable capacitor array 53 is coupled to analog ground potential 43 by a switching circuit 59 and the output terminal of programmable capacitor array 53 is coupled to analog ground potential 43 by a switching circuit 63. An output signal appearing at output node $V_{o2}$ is applied to other functional circuitry (not shown). Switching circuits 59 and 63 operate in response to the first phase ($100_1$) of the system clock, whereas switching circuits 58 and 62 operate in response to the second phase ($100_2$) of the system clock.

It should be noted that the first ($100_1$) and second phases ($100_2$) of the system clock are complementary and non-overlapping such that switching circuits 51 and 52 and switching circuits 56 and 57 open and close in a complementary and non-overlapping manner to store and transfer charge from the output of OPAMP 42 through programmable capacitor array 50 to output node $V_{o1}$. Likewise, switching circuits 58 and 59 and switching circuits 62 and 63 open and close in a complementary and non-overlapping manner to store and transfer charge from the output of OPAMP 42 through programmable capacitor array 53 to output node $V_{o2}$. In other words, switched-capacitor circuit 40 is configured to provide, for example, an amplifying function and/or a filtering function. Switching circuits 51, 56, 58, and 62 close during the first phase of the system clock to transfer charge through the circuit. Switching circuits 52, 57, 59, and 63 close in response to the second phase of the system clock to discharge the previous signal at the respective nodes of the circuit.

In order to provide the amplifying and filtering functions, programmable capacitor arrays 44, 50, and 53 include an array of capacitors coupled in parallel wherein each capacitor is capable of being switched into the circuit in response to external digital signals. More particularly, programmable capacitor arrays 44, 50, and 53 serve as representations of a programmable capacitor array such as, for example, programmable capacitor arrays 10 or 10' described with reference to FIGS. 1 and 3, respectively. The capacitance values of the programmable capacitor arrays 44, 50, and 53 are programmed to set the gain and/or filter characteristics of switched-capacitor circuit 40 by selecting the ratios of the programmable capacitor arrays to each other and to other capacitors (not shown) that might be required to implement the desired circuit function.

By now it should be appreciated that a programmable capacitor array and a method of programming the capacitor array have been provided. An advantage of the present invention is that each capacitor of the programmable capacitor array may be selectively isolated from the programmable capacitor array. In particular, both terminals of each capacitor of the programmable capacitor array may be grounded, thereby electrically removing the grounded capacitor from the circuit nodes to which it is coupled. In other words, the present invention provides a capacitor array and a method of programming the capacitor array that reduces capacitive loading on the circuit nodes to which the programmable capacitor array is coupled. Another advantage of the present invention includes a reduction in the area of the programmable capacitor array by reducing the sizes of the switching circuits.

We claim:

1. An array of capacitors that can be selectively coupled to one another to form a programmable capacitor array, comprising:

a first capacitor having first and second terminals;

a second capacitor having first and second terminals;

a first switching circuit coupled between a first circuit node and said first terminal of the first capacitor;

a second switching circuit coupled between the first terminal of the first capacitor and a first reference terminal;

a third switching circuit coupled between a second circuit node and the second terminal of the first capacitor;

a fourth switching circuit coupled between the second terminal of the first capacitor and a second reference terminal;

a fifth switching circuit coupled between the first circuit node and the first terminal of the second capacitor;

a sixth switching circuit coupled between the first terminal of the second capacitor and the first reference terminal;

a seventh switching circuit coupled between the second circuit node and the second terminal of the second capacitor; and an eighth switching circuit coupled between the second terminal of the second capacitor and the second reference terminal.

2. The programmable capacitor array of claim 1, wherein the first and third switching circuits are programmed by a digital signal.

3. The programmable capacitor array of claim 2, wherein the second and fourth switching circuits are programmed by an inverted digital signal.

4. The programmable capacitor array of claim 3, wherein the first switching circuit includes a control electrode, a first current conducting electrode, and a second current conducting electrode, the control electrode being coupled for receiving the digital signal, the first current conducting electrode being coupled to the first circuit node, and the second current conducting electrode being coupled to the first terminal of the first capacitor.

5. The programmable capacitor array of claim 4, wherein the second switching circuit includes a control electrode, a first current conducting electrode, and a second current conducting electrode, the control electrode being coupled for receiving the inverted digital signal, the first current conducting electrode being coupled to the first terminal of the first capacitor, and the second current conducting electrode being coupled to the first reference terminal.

6. The programmable capacitor array of claim 5, wherein the third switching circuit includes a control electrode, a first current conducting electrode, and a second current conducting electrode, the control electrode being coupled for receiving the digital signal, the first current conducting electrode being coupled to the second circuit node, and the second current conducting electrode being coupled to the second terminal of the first capacitor, and the fourth switching circuit includes a control electrode, a first current conducting electrode, and a second current conducting electrode, the control electrode being coupled for receiving the inverted digital signal, the first current conducting electrode being coupled to the second terminal of the first capacitor, and the second current conducting electrode being coupled to the second reference terminal.

7. The programmable capacitor array of claim 1, wherein the first and second reference terminals are coupled to a same potential.

8. The programmable capacitor array of claim 1, wherein the first, second, third, and fourth switching circuits each have an on-resistance, wherein the on-resistances of the first and the third switching circuits is less than the on-resistances of the second and the fourth switching circuits.

9. The programmable capacitor array of claim 1, wherein a sum of the on-resistances of the first and third switching circuits is less than a predetermined value.

10. A capacitance network having first, second, and third network terminals, wherein capacitance values of the capacitance network are programmable, the capacitance network comprising:

a plurality of capacitors, each capacitor of the plurality of capacitors having a first terminal and a second terminal;

means for selectively coupling the first terminal of each capacitor of the plurality of capacitors to the first network terminal and to the third network terminal; and means for selectively coupling the second terminal of each capacitor of the plurality of capacitors to the second network terminal and to the third network terminal.

11. The capacitance network of claim 10, wherein the plurality of capacitors comprises:

a first capacitor having a first capacitance value;

a second capacitor having a second capacitance value, the second capacitance value being half of the first capacitance value;

a third capacitor having a third capacitance value, the third capacitance value being half of the second capacitance value;

a fourth capacitor having a fourth capacitance value, the fourth capacitance value being half of the third capacitance value;

a fifth capacitor having a fifth capacitance value, the fifth capacitance value being half of the fourth capacitance value;

a sixth capacitor having a sixth capacitance value, the sixth capacitance value being half of the fifth capacitance value;

a seventh capacitor having a seventh capacitance value, the seventh capacitance value being half of the sixth capacitance value; and an eighth capacitor having an eighth capacitance value, the eighth capacitance value being half of the seventh capacitance value.

12. The capacitance network of claim 11, wherein the means for selectively coupling the first terminal of each capacitor to the first network terminal and to the third network terminal comprises:

a first plurality of transmission gates, each transmission gate of the first plurality of transmission gates having first and second signal terminals and first and second control terminals, wherein the first signal terminal of each transmission gate of the first plurality of transmission gates is coupled to the first network terminal;

a second plurality of transmission gates, each transmission gate of the second plurality of transmission gates having first and second signal terminals and first and second control terminals, wherein the first signal terminal of each transmission gate of the second plurality of transmission gates is coupled to the third network terminal, and wherein the second signal terminals of first transmission gates of the first and second plurality of transmission gates are coupled to the first terminal of the first capacitor, the second signal terminals of second transmission gates of the first and second plurality of transmission gates are coupled to the first terminal of the second capacitor, the second signal terminals of third transmission gates of the first and second plurality of transmission gates are coupled to the first terminal of the third capacitor, the second signal terminals of fourth transmission gates of the first and second plurality of transmission gates are coupled to the first terminal of the fourth capacitor, the second signal terminals of fifth transmission gates of the first and second plurality of transmission gates are coupled to the first terminal of the fifth capacitor, the second signal terminals of sixth transmission gates of the first and second plurality of transmission gates are coupled to the first terminal of the sixth capacitor, the second signal terminals of seventh transmission gates of the first and second plurality of transmission gates are coupled to the first terminal of the seventh capacitor, the second signal terminals of eighth transmission gates of the first and second plurality of transmission gates are coupled to the first terminal of the eighth capacitor, and wherein the means for selectively coupling the second terminal of each capacitor to the second network terminal and to the third network terminal comprises:

a third plurality of transmission gates, each transmission gate of the third plurality of transmission gates having first and second signal terminals and first and second control terminals, wherein the first signal terminal of each transmission gate of the third plurality of transmission gates is coupled to the second network terminal;

a fourth plurality of transmission gates, each transmission gate of the fourth plurality of transmission gates having first and second signal terminals and first and second control terminals, wherein the first signal terminal of each transmission gate of the fourth plurality of transmission gates is coupled to the third network terminal, and wherein the second signal terminals of first transmission gates of the third and fourth plurality of transmission gates are coupled to the second terminal of the first capacitor, the second signal terminals of second transmission gates of the third and fourth plurality of transmission gates are coupled to the second terminal of the second capacitor, the second signal terminals of third transmission gates of the third and fourth plurality of transmission gates are coupled to the second terminal of the third capacitor, the second signal terminals of fourth transmission gates of the third and fourth plurality of transmission gates are coupled to the second terminal of the fourth capacitor, the second signal terminals of fifth transmission gates of the third and fourth plurality of transmission gates are coupled to the second terminal of the fifth capacitor, the second signal terminals of sixth transmission gates of the third and fourth plurality of transmission gates are coupled to the second terminal of the sixth capacitor, the second signal terminals of seventh transmission gates of the third and fourth plurality of transmission gates are coupled to the second terminal of the seventh capacitor, the second signal terminals of eighth transmission gates of the third and fourth plurality of transmission gates are coupled to the second terminal of the eighth capacitor.

13. The capacitance network of claim 10, wherein the means for selectively coupling the first terminal of each capacitor to the first network terminal and to the third network terminal comprises a first plurality of switching elements, wherein the first terminal of each capacitor is coupled to the first network terminal and to the third network terminal by separate switching elements of the first plurality of switching elements.

14. The capacitance network of claim 13, wherein the means for selectively coupling the second terminal of each capacitor to the second network terminal and to the third network terminal comprises a second plurality of switching elements, wherein the second terminal of each capacitor is coupled to the second network terminal and to the third network terminal by separate switching elements of the second plurality of switching elements.

15. A circuit having an array of capacitors capable of being selectively coupled across one another to provide a desired capacitance value, comprising:

an operational amplifier having a first input terminal, a second input terminal, and an output terminal; and the programmable capacitor array coupled to receive an output signal from the operational amplifier, the programmable capacitor array comprising:

a first capacitor having first and second terminals;

a first switching circuit coupled between a first circuit node and said first terminal of the first capacitor;

a second switching circuit coupled between the first terminal of the first capacitor and a first reference terminal;

a third switching circuit coupled between a second circuit node and the second terminal of the first capacitor;

a fourth switching circuit coupled between the second terminal of the first capacitor and a second reference terminal;

a second capacitor having first and second terminals;

a fifth switching circuit coupled between a first circuit node and said first terminal of the second capacitor;

a sixth switching circuit coupled between the first terminal of the second capacitor and the first reference terminal;

a seventh switching circuit coupled between the second circuit node and the second terminal of the second capacitor; and an eighth switching circuit coupled between the second terminal of the second capacitor and the second reference terminal.

16. The circuit of claim 15, wherein the array of capacitors is coupled to the output terminal of the operational amplifier via a ninth switching circuit.

17. The circuit of claim 16, wherein the array of capacitors is coupled to a reference potential via a tenth switching circuit.

18. A method of programming a capacitor array, comprising the steps of:

providing first and second capacitors;

coupling the first capacitor between first and second circuit nodes in response to a control signal;

coupling the second capacitor between the first and second circuit nodes in response to the control signal;

isolating the first capacitor from the first and second circuit nodes in response to an inverted control signal; and isolating the first capacitor from the first and second circuit nodes in response to an inverted control signal.

19. The method of claim 18, wherein the step of isolating the first capacitor includes the step of coupling a first terminal of the first capacitor to a first reference terminal in response to the inverted control signal.

20. The method of claim 18 wherein the step of isolating the first capacitor includes the step of coupling a second terminal of the first capacitor to a second reference terminal in response to the inverted control signal.

* * * * *